United States Patent
Shayegani

(10) Patent No.: US 10,109,441 B1
(45) Date of Patent: Oct. 23, 2018

(54) NON-BLOCKINGS SWITCH MATRIX

(71) Applicant: Space Systems/Loral, LLC, Palo Alto, CA (US)

(72) Inventor: Ali Shayegani, Los Altos, CA (US)

(73) Assignee: Space Systems/Loral, LLC, Palo Alto, CA (US)

( * ) Notice: Subject to any disclaimer, the term of this patent is extended or adjusted under 35 U.S.C. 154(b) by 309 days.

(21) Appl. No.: 14/989,612

(22) Filed: Jan. 6, 2016

Related U.S. Application Data

(60) Provisional application No. 62/192,440, filed on Jul. 14, 2015.

(51) Int. Cl.
*H01P 1/12* (2006.01)
*G02B 6/42* (2006.01)
*H01H 47/22* (2006.01)

(52) U.S. Cl.
CPC .................................. *H01H 47/22* (2013.01)

(58) Field of Classification Search
CPC combination set(s) only.
See application file for complete search history.

(56) References Cited

U.S. PATENT DOCUMENTS

| 7,778,506 | B2 | 8/2010 | Daneshmand et al. |
| 8,547,727 | B2* | 10/2013 | Wu .................. H01L 45/145 |
| | | | 365/148 |
| 2004/0155725 | A1 | 8/2004 | Kwiatkowski |
| 2006/0176124 | A1 | 8/2006 | Mansour et al. |
| 2017/0104463 | A1* | 4/2017 | Gonzalez Esteban .... H03F 5/00 |

FOREIGN PATENT DOCUMENTS

CA      1129508 A      8/1982

OTHER PUBLICATIONS

Daneshmand, Mojgan, 2006, "Multi-Port RF MEMS Switches and Switch Matrices," *University of Waterloo* pp. 1-178.

* cited by examiner

*Primary Examiner* — An Luu
(74) *Attorney, Agent, or Firm* — Weaver Austin Villeneuve & Sampson LLP

(57) ABSTRACT

This disclosure provides systems, methods and apparatus for implementing a non-blocking switch matrix. In one aspect, a switch matrix can include an arrangement of C-switches. Each of the C-switches can be configured to switch between two positions to couple between different channels. The C-switches can be arranged in the switch matrix as to provide non-blocking functionality such that each of the inputs of the switch matrix is routed to an output of the switch matrix in any combination of the configurations of the C-switches.

19 Claims, 13 Drawing Sheets

# NON-BLOCKINGS SWITCH MATRIX

PRIORITY DATA

This patent document claims priority to commonly assigned U.S. Provisional Patent Application No. 62/192,440, titled "Non-Blocking Switch Matrix," by Shayegani, filed on Jul. 14, 2015, which is hereby incorporated by reference in its entirety and for all purposes.

TECHNICAL FIELD

This invention relates generally to a non-blocking switch matrix, and more particularly to using an arrangement of C-switches to implement a non-blocking switch matrix.

BACKGROUND

The assignee of the present invention manufactures and deploys spacecraft for, inter alia, communications and broadcast services. Payload systems for such spacecraft may include high power microwave radio frequency (RF) components such as travelling wave tube amplifiers (TWTA's). The payload may include a number of channels or paths in order to provide system redundancy or other functionalities that require switching. A substantial number of switches are necessary to enable redundant components to be switched in for components that have failed and to facilitate switching between alternate channels.

Thus, an improved arrangement implementing the substantial number of switches for switching is desired.

SUMMARY

The systems, methods and devices of this disclosure each have several innovative aspects, no single one of which is solely responsible for the desirable attributes disclosed herein.

One innovative aspect of the subject matter described in this disclosure can be implemented in an apparatus comprising a plurality of four port rotary C-switches arranged in a switch matrix, the switch matrix having N inputs and M outputs, wherein: each of the plurality of C-switches is switchable from a first position to a second position, such that in the first position a first channel is coupled with a second channel and a third channel is coupled with a fourth channel, and, in the second position, the second channel is coupled with the fourth channel and the first channel is coupled with the third channel; and the switch matrix is configured to provide a non-blocking switch-selectable routing between any of the N inputs and any of the M outputs, the switch selectable routing being determined by the respective positions of the plurality of C-switches.

In some implementations, N equals M.

In some implementations, the plurality of C-switches is a quantity of (N(N−1))/2 C-switches.

In some implementations, the C-switches are arranged in a plurality of columns and a plurality of rows, each column corresponding to a different number of C-switches in comparison with other columns, and each row corresponding to a different number of C-switches in comparison with other rows.

In some implementations, the plurality of C-switches include a first quantity of C-switches arranged in a first column of the plurality of columns, and a second quantity of C-switches arranged in first row of the plurality of rows.

In some implementations, the first quantity equals N−1; one C-switch in the first column is coupled with two of the N inputs, each of a first remaining quantity of N−2 C-switches in the first column is coupled a respective one of the N inputs; the second quantity equals M−1; and one C-switch in the first row is coupled with two of the M outputs, each of a second remaining quantity of M−2 C-switches in the first row is coupled with one of the M outputs.

In some implementations, the plurality of rows includes a second row, and each C-switch in the first row receives at least one input from C-switches in the second row.

In some implementations, the plurality of columns includes a second column, and each C-switch in the first column provides an input to a C-switch in the second column.

In some implementations, the switch matrix comprises waveguides, coaxial cables, or a combination of both to communicatively couple the C-switches together.

In some implementations, the apparatus further comprises a controller configured to cause the switch matrix to switch between a plurality of switch-selectable routings by switching one or more of the C-switches in the switch matrix from the first position to the second position or the second position to the first position to route one of the N inputs to another output of the M outputs.

Another innovative aspect of the subject matter described in this disclosure can be implemented in a system comprising: a plurality of four port rotary C-switches arranged in a switch matrix, the switch matrix having N inputs and M outputs; and a controller configured to provide control signals to the plurality of C-switches; wherein each of the plurality of C-switches has a first input, a second input, a first output, and a second output, and each of the C-switches is configured to provide the first input to the first output and the second input to the second output in a first position and to provide the first input to the second output and the second input to the first output in a second position; and the switch matrix is configured to provide a non-blocking switch-selectable routing between any of the N inputs and any of the M outputs, the switch selectable routing being determined by the control signals setting respective positions of the plurality of C-switches.

In some implementations, the plurality of C-switches is a quantity of (N(N−1))/2 C-switches.

In some implementations, N equals M.

In some implementations, the C-switches in the switch matrix are arranged in columns and rows, each column corresponding to a different number of C-switches in comparison with other columns, and each row corresponding to a different number of C-switches in comparison with other rows.

In some implementations, the columns includes a first column having N−1 C-switches and wherein the rows includes a first row having N−1 C-switches.

In some implementations, one C-switch in the first column is coupled with two of the N inputs, each of a first remaining quantity of N−2 C-switches in the first column is coupled a respective one of the N inputs; and one C-switch in the first row is coupled with two of the M outputs, each of a second remaining quantity of M−2 C-switches in the first row is coupled with one of the M outputs.

In some implementations, the rows include a second row, and each C-switch in the first row receives at least one input from C-switches in the second row, and the columns include a second column, and each C-switch in the first column provides an input to a C-switch in the second column.

In some implementations, the switch matrix comprises waveguides, coaxial cables, or a combination of both to communicatively couple the C-switches together.

Another innovative aspect of the subject matter described in this disclosure can be implemented in a method comprising receiving, by a controller, data corresponding to C-switches coupled together to provide a matrix having a set of inputs and a set of outputs, the matrix being a non-blocking switch matrix with (N(N−1))/2 number of C-switches; and generating, by the controller, control signals to adjust configurations of the C-switches of the matrix to change the routing between the set of inputs and the set of outputs.

In some implementations, the control signals are provided to sequentially adjust the C-switches.

BRIEF DESCRIPTION OF THE DRAWINGS

The included drawings are for illustrative purposes and serve only to provide examples of possible structures for the disclosed inventive switching arrangement. These drawings in no way limit any changes in form and detail that may be made by one skilled in the art without departing from the spirit and scope of the disclosed embodiments.

Figure 1:
FIGS. 1A and 1B shows examples of a four port, two channel rotary switch ("C-switch").

Throughout the drawings, the same reference numerals and characters, unless otherwise stated, are used to denote like features, elements, components, or portions of the illustrated embodiments. Moreover, while the subject invention will now be described in detail with reference to the drawings, the description is done in connection with the illustrative embodiments. It is intended that changes and modifications can be made to the described embodiments without departing from the true scope and spirit of the disclosed subject matter, as defined by the appended claims.

DETAILED DESCRIPTION

Specific exemplary embodiments of the invention will now be described with reference to the accompanying drawings. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "connected" or "coupled" to another element, it can be directly connected or coupled to the other element, or intervening elements may be present. It will be understood that although the terms "first" and "second" are used herein to describe various elements, these elements should not be limited by these terms. These terms are used only to distinguish one element from another element. As used herein, the term "and/or" includes any and all combinations of one or more of the associated listed items. The symbol "/" is also used as a shorthand notation for "and/or".

The terms "spacecraft", "satellite" may be used interchangeably herein, and generally refer to any orbiting satellite or spacecraft system.

FIGS. 1A and 1B show examples of a four port, two channel rotary switch ("C-switch"). The C-switches in FIGS. 1A and 1B are electromechanical switches including a rotor that can switch between two positions (e.g., by rotating clockwise or counter-clockwise) based on the angular position of the rotor.

For example, in FIG. 1A, C-switch 100 includes rotor 110 configured in a position to couple channel 140 with channel 150 and couple channel 170 with channel 160. As a result, a signal (e.g., microwave energy) can be transferred between the coupled channels. Likewise, channel 170 and channel 160 can also be coupled to provide passages or paths such that a signal can also be transferred between the two coupled channels. For example, if channel 140 and channel 170 are inputs and channel 150 and channel 160 are outputs, the signal provided by the inputs at channel 140 and channel 170 can be transferred through C-switch 100 to outputs at channel 150 and channel 160, respectively, due to the angular position of rotor 110 coupling the inputs to the respective outputs. The angular position illustrated in FIG. 1A may be referred to herein as an "up" position.

When the angular position of rotor 110 changes as rotor 110 rotates, the pairings of inputs to outputs may change to provide different channels. For example, in FIG. 1B, rotor 110 of C-switch 100 is illustrated as having been rotated to a new angular position which may be referred to herein as a "down" position. By contrast to the up position illustrated in FIG. 1A, in the down position illustrated in FIG. 1B, channel 140 is now coupled with channel 170, and channel 150 is coupled with channel 160. Accordingly, signals may be transferred through different channels based on the angular position of rotor 110 of C-switch 100.

Figure 2:
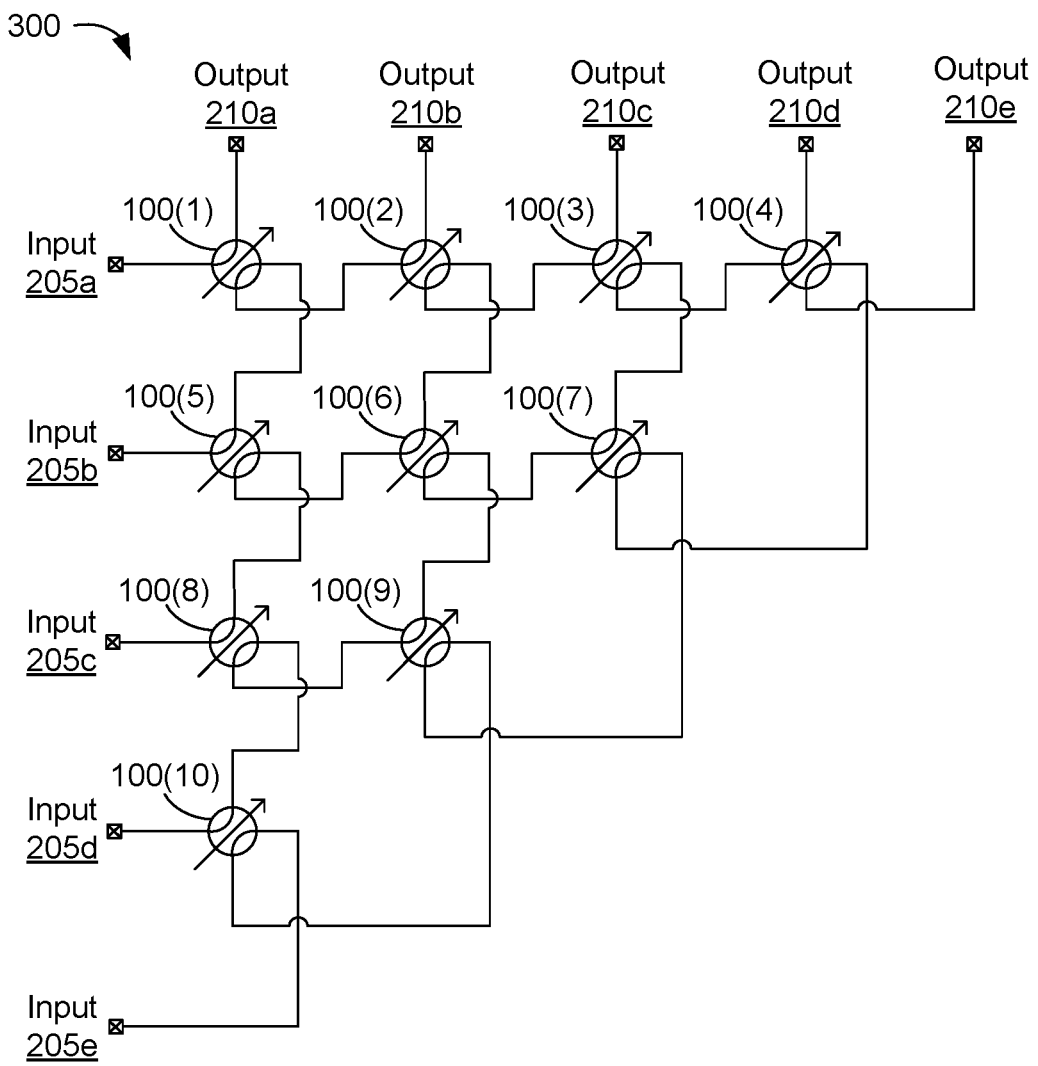
FIG. 2 shows an example of a matrix arrangement of C-switches.

FIG. 2 shows an example of a matrix arrangement of C-switches according to an implementation. The illustrated matrix 300 includes ten C-switches 100(1)-(10) coupled together to provide a five-input-by-five-output (5×5) non-blocking switch matrix. Although for clarity of illustration matrix 300 is depicted as being laid out in a planar arrangement in FIG. 2, in other implementations, C-switches 100 (1)-(10) can be laid out in other ways, for example, in multiple layers with the same interconnects between C-switches 100(1)-(10) to provide a similar arrangement or collection.

Matrix 300 in FIG. 2 includes five inputs 205a-e and five outputs 210a-e. The arrangement of C-switches may be referred to as a "non-blocking array" of switches because, irrespective of the angular positions of rotors 110 of the C-switches in matrix 300, each input may be routed, or coupled, to exactly one corresponding output, and each output may be coupled to exactly one corresponding input. For example, input 205a may be coupled with output 210a, input 205b may be coupled with output 210b, input 205c may be coupled with output 210c, input 205d may be coupled with output 210d, and input 205e may be coupled with output 210e to provide non-blocking functionality.

The number of columns of C-switches in matrix 300 in FIG. 2 is N−1 columns, where N is the number of inputs or outputs. That is, for the 5×5 non-blocking switch matrix of FIG. 2, the C-switches are arranged within four columns. The columns may include a different number of C-switches. For example, in FIG. 2, a first column can include four C-switches (i.e., C-switches 100(1), (5), (8), and (10)), a second column can include three C-switches (i.e., C-switches 100(2), (6), and (9)), a third column can include two C-switches (i.e., C-switches 100(3) and (7)), and a fourth column can include C-switch 100(4).

Likewise, the number of rows of C-switches in FIG. 2 is also N−1 rows, where N is the number of inputs or outputs. Each of the rows may also include a different number of C-switches. For example, in FIG. 2, a first row can include four C-switches (i.e., C-switches 100(1), (2), (3), and (4)), a second row can include three C-switches (i.e., C-switches 100(5), (6), and (7)), a third row can include two C-switches (i.e., C-switches 100(8) and (9)), and a fourth row can include C-switch 100(10).

Each C-switch in a column provides an input to a C-switch in a subsequent column with one less C-switch. For example, in FIG. 2, each of the C-switches in the first column with four C-switches provides at least one input to one of the three C-switches in the second column. As an example, C-switch 100(5) in the first column provides an input to C-switch 100(6) in the second column. C-switches 100(8) and (10) provide separate inputs to C-switch 100(9).

Each C-switch in a row receives an input from a previous row. For example, in FIG. 2, C-switch 100(6) in the second row receives an input from C-switch 100(9) in the third row. That is, C-switches in a row with X−1 number of switches provide inputs to C-switches in a row with X number of switches.

Additionally, the C-switches in the column with the most C-switches can receive the inputs. For example, in FIG. 2, C-switch 100(1) receives input 205a, C-switch 100(5) receives 205b, C-switch 100(8) receives input 205c, and C-switch 100(1) receives inputs 205d and 205e. Moreover, the C-switches in the row with the most C-switches can provide the outputs. For example, in FIG. 2, C-switch 100(1) provides output 210a, C-switch 100(2) provides output 210b, C-switch 100(3) provides output 210c, and C-switch 100(4) provides outputs 210d and 210e. Accordingly, N−2 C-switches each provide one output and one C-switch provides two outputs. N−2 C-switches each receive one input and one C-switch receives two inputs.

The selection of a coupling path between inputs and outputs may be adjusted by rotating one or more of the rotors 110 of the C-switches 100 in the manner described in more detail below. FIGS. 3A-D show examples of configurations of the matrix of C-switches in FIG. 2.

Figure 3A:
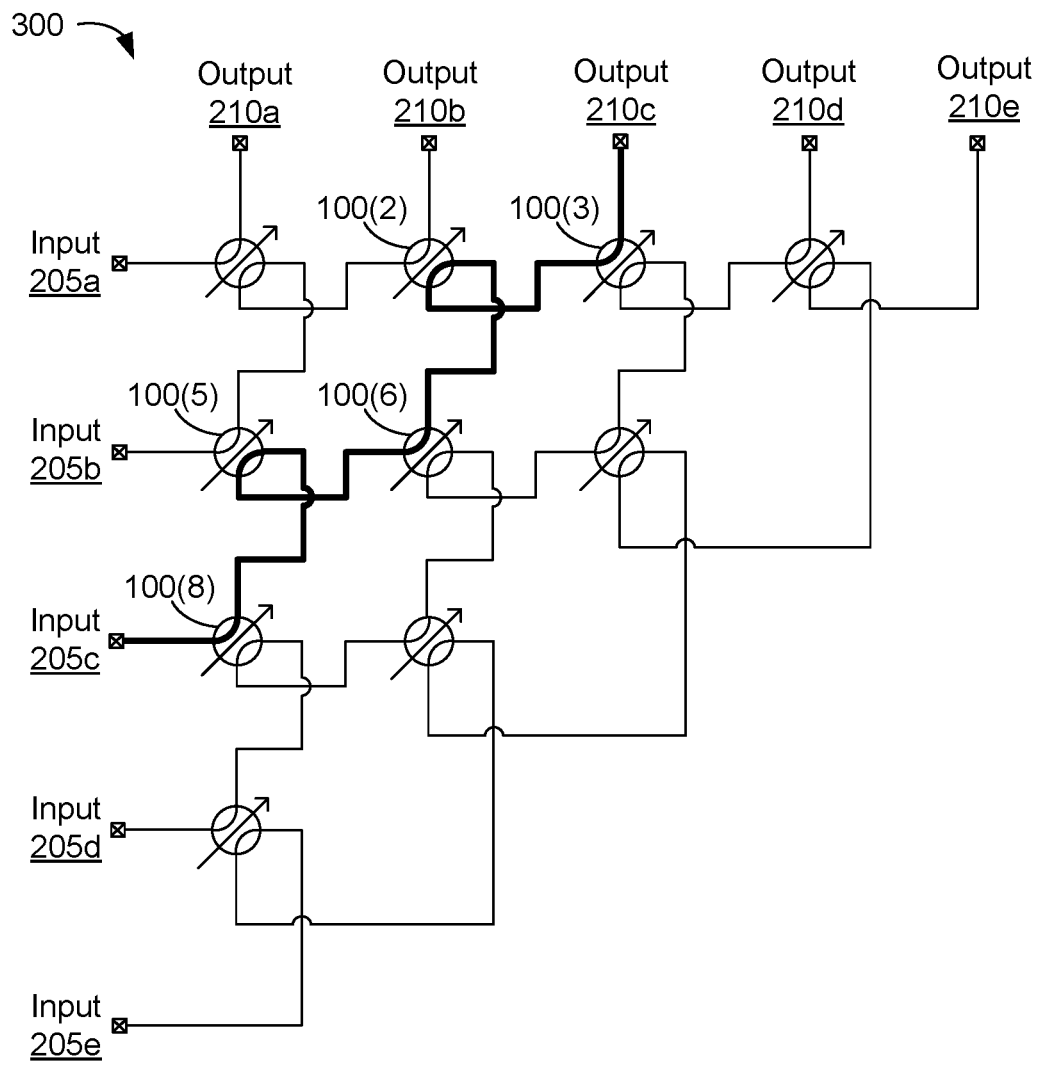
FIGS. 3A-D show examples of configurations of the arrangement of C-switches in FIG. 2.
Figure 3B:
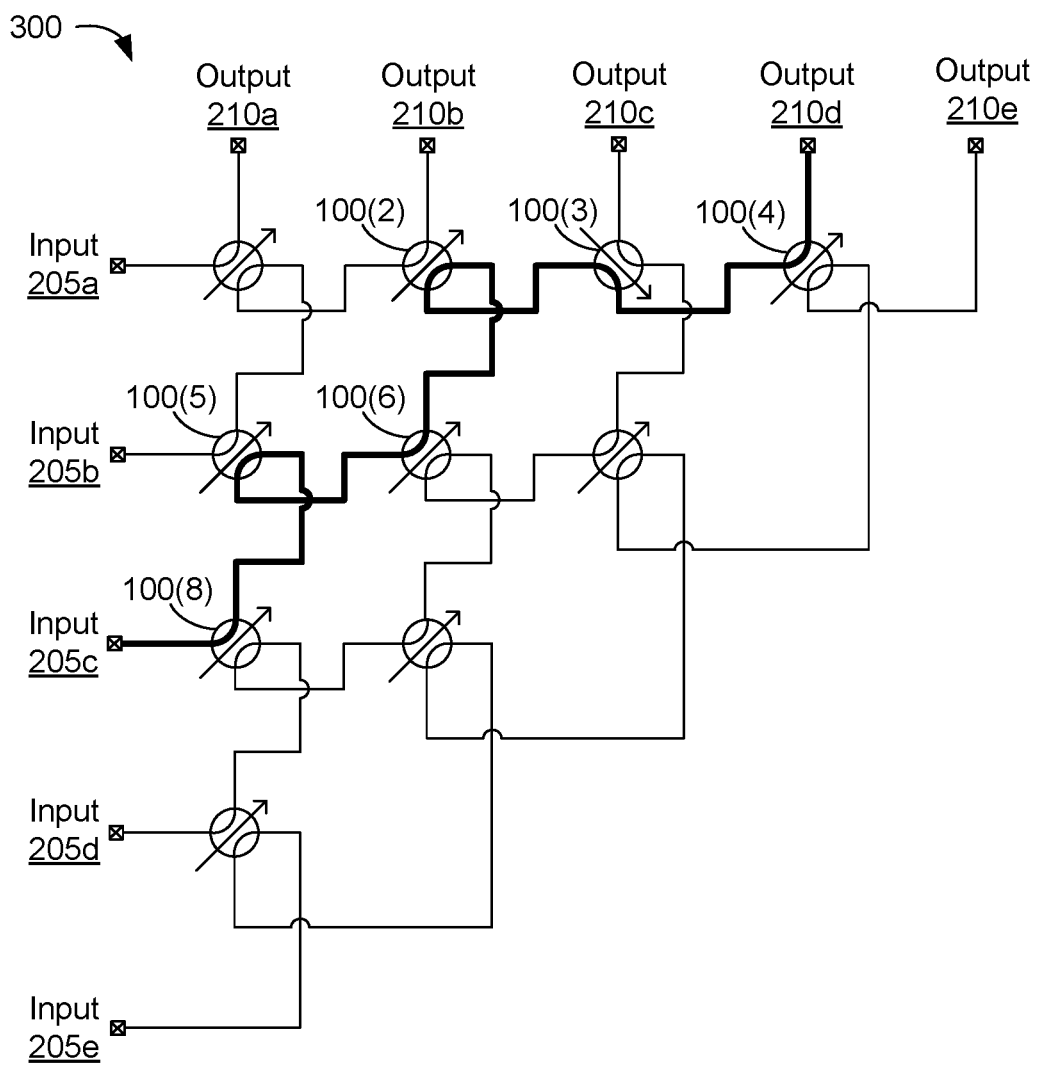

In FIG. 3A, each of the rotors 110 of C-switches 100(1)-(10) in matrix 300 are in the up position, and therefore, input 205c is routed to output 210c in a coupling path through C-switches 100(8), 100(5), 100(6), 100(2), and 100(3) and the corresponding interconnect among those switches. If input 205c is to be routed to output 210d, then the angular position of rotor 110 of C-switch 100(3) can be adjusted to the down position to change the connectivity among the C-switches coupled with C-switch 100(3), and therefore, the configuration of matrix 300. For example, in FIG. 3B, C-switch 100(3) provides different connectivity within matrix 300 than in FIG. 3A by providing a coupling path for input 205c to be coupled with output 210d, resulting in a different configuration of matrix 300. As a result, input 205c is now routed to output 210d, as shown with the path highlighted in FIG. 3B.

Figure 3C:
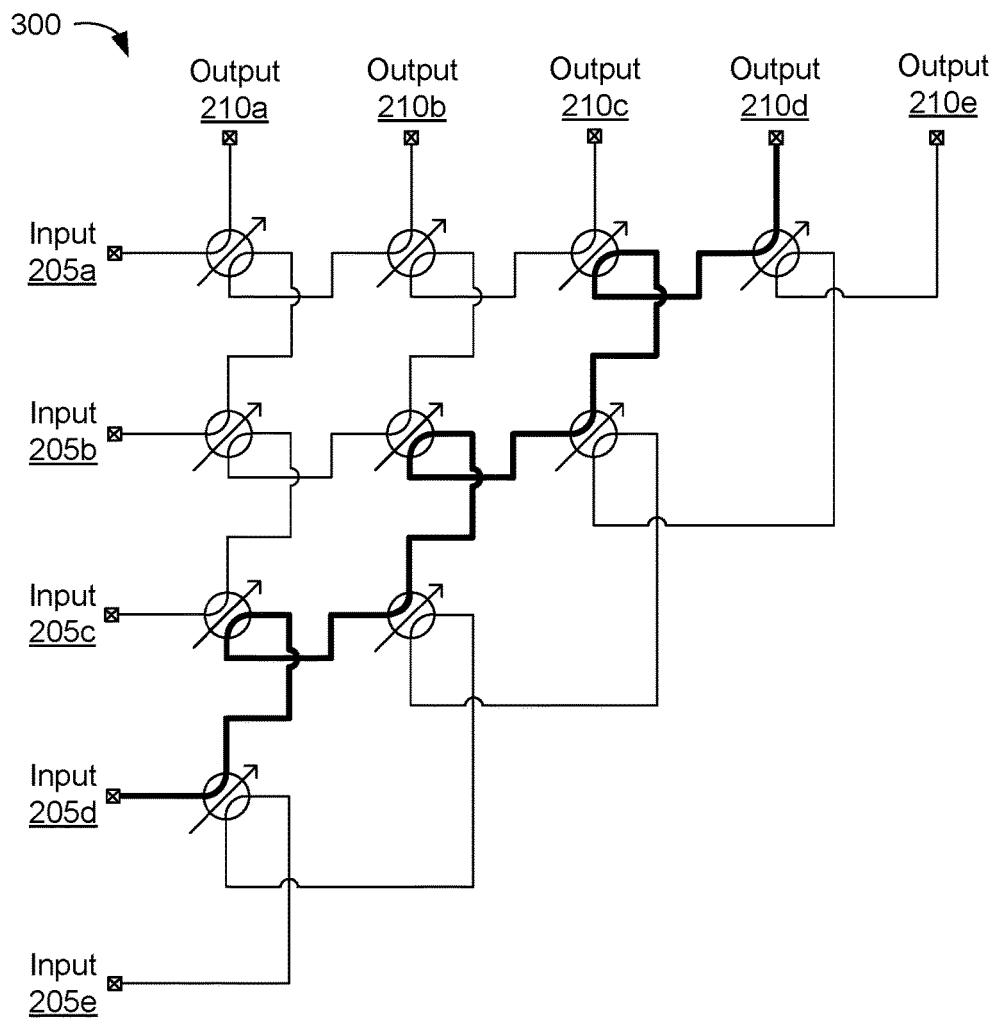
Figure 3D:
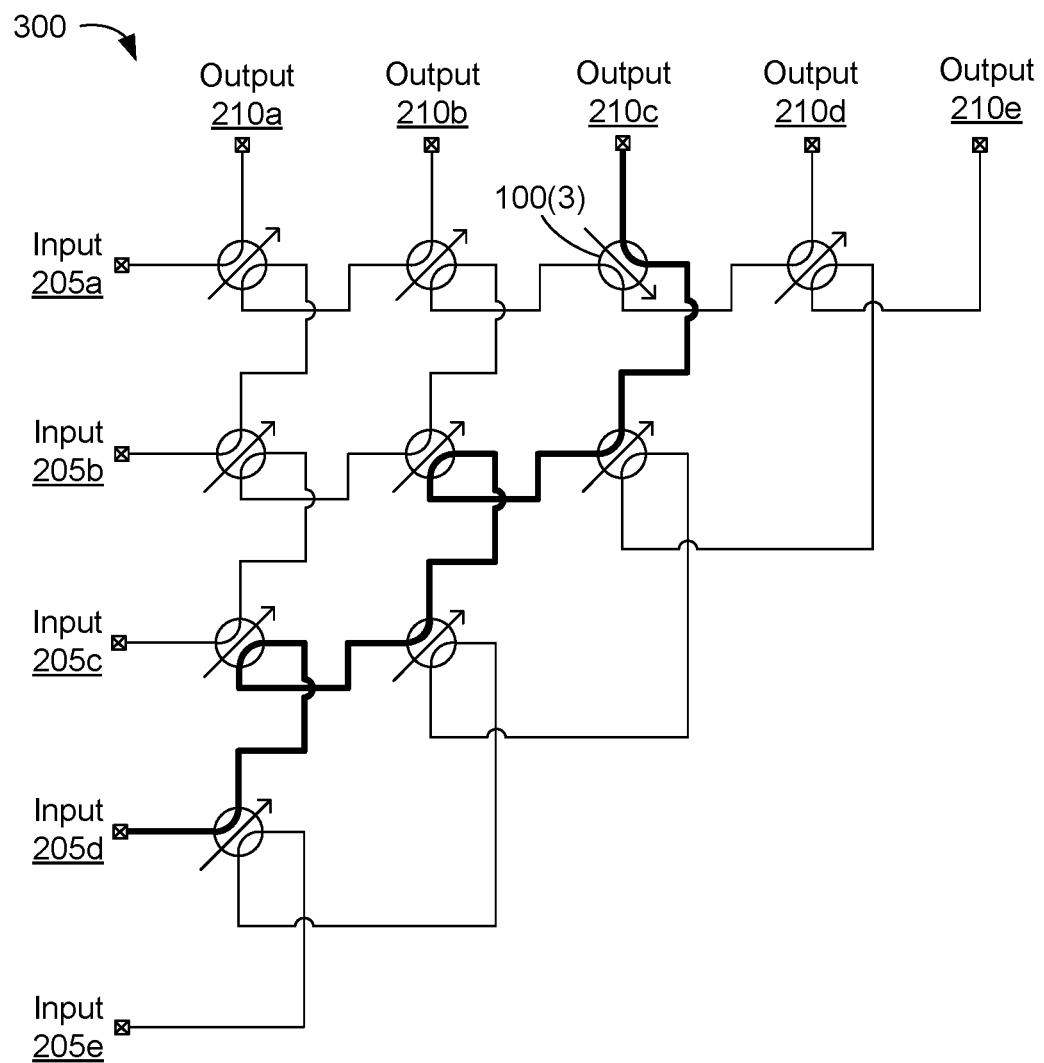

Additionally, input 205d is initially routed to output 210d, as highlighted in FIG. 3C. By changing the angular position of rotor 110 of C-switch 100(3) in matrix 300 in FIG. 3B, input 205d is also now routed to output 210c as in FIG. 3D. That is, the corresponding outputs of inputs 205c and 205d switch based on C-switch 100(3) changing from the up position to the down position. In the examples of FIGS. 3A-D, by changing the configuration of matrix 300 via changing the angular position of rotor 110 of C-switch 100(3), two inputs (i.e., inputs 205c and 205d) switch outputs they are coupled to. That is, the output that was previously provided to input 205d is now coupled to input 205c, and the output that was previously provided to input 205c is now coupled to input 205d.

As another example, if the angular position of rotor 110 of C-switch 100(1) in FIG. 2 is in the up position, then the configuration of matrix 300 allows for input 205a to be coupled with output 210a, and input 205b to be coupled with 210b. If the angular position of rotor 110 of C-switch 100(1) is in the down position, then the configuration of matrix 300 allows for input 205a to be coupled with output 210b, and input 205b to be coupled with output 210a. As a result, changing the angular position of rotor 110 of one of C-switches 100(1)-(10) changes the coupling of inputs to outputs, for example, by switching pairings of inputs to outputs for each C-switch 100(1)-(10) that is changed. Multiple C-switches 100(1)-(10) can have the angular rotations of their rotors 110 change, either simultaneously, sequentially, or partially simultaneously (e.g., with some partial overlap in time of when the rotors 110 rotate). A subset of C-switches 100(1)-(10) can be in the up position, and another subset of C-switches 100(1)-(10) can be in the down position to provide the configuration of matrix 300 to allow for the desired couplings between inputs 205a-e to outputs 210a-e.

Accordingly, any number of the C-switches in matrix 300 can be adjusted to change the configuration of matrix 300 to provide a different connectivity so that inputs can be routed to different outputs. However, in any configuration of matrix 300, each input is routed to a single output, and each output receives a signal from a single input. That is, each input-to-output pair may have a coupling path provided by matrix 300. Any input can be routed to any output. Accordingly, matrix 300 composed of C-switches provides a non-blocking switch-selectable routing between any of the inputs and any of the outputs.

In accordance with some implementations of the presently disclosed techniques, the non-blocking functionality of matrix 300 may be provided when the following equation is met:

$$\text{Number of Switches} = \frac{N(N-1)}{2}$$

In the above equation, N is the number of inputs or outputs in an N×N matrix (i.e., the number of inputs is the same as the number of outputs). For example, for the 5×5 matrix 300 in FIGS. 2 and 3A-3D, the minimum number of switches to implement a non-blocking matrix of C-switches is 10.

Figure 8:
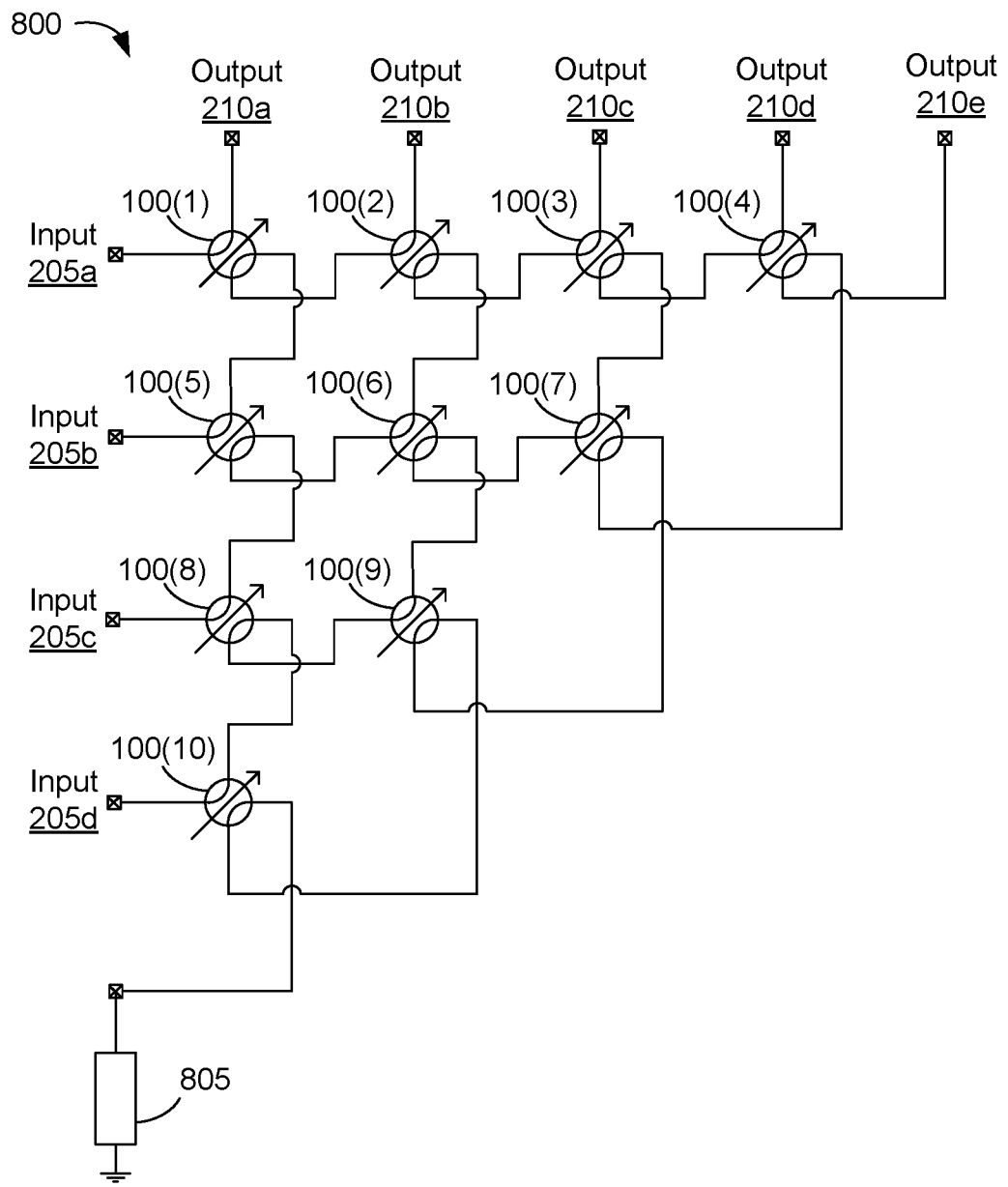
FIG. 8 shows an example of a matrix arrangement of C-switches with a different number of inputs to outputs.

Though the example of FIG. 2 shows a 5×5 matrix, other matrix sizes may also be implemented to provide an N×N matrix with N being an integer. For example, for a 6×6 matrix, the minimum number of switches to implement a non-blocking matrix of C-switches is 15. As another example, for a 4×4 matrix, the minimum number of switches to implement a non-blocking switch matrix of C-switches is 6. As another example, for a 10×10 matrix, the minimum number of switches to implement a non-blocking matrix of C-switches is 45. As a result, matrix 300 may be scalable (i.e., larger or smaller). In other implementations, an M×N matrix may be implemented. That is, a matrix with the inputs and outputs being different numbers can also be implemented. In an M×N matrix, the absolute value of (M−N) number of inputs or outputs (depending on whether M or N is larger) can be terminated. FIG. 8 shows an example of a matrix arrangement of C-switches with a different number of inputs to outputs. Matrix 800 in FIG. 8 includes a similar arrangement of C-switches 100(1)-(10) as matrix 200 of FIG. 2, but only includes four inputs providing signals to be routed to outputs 210a-210e rather than five inputs. In particular, input 205e in FIG. 2 has been replaced with terminating load 805 (e.g., a resistor) to terminate one of the inputs to C-switch 100(1) such that matrix 800 provides a 4×5 matrix (i.e., four inputs and five outputs).

Advantageously, the disclosed techniques prevent an output from being routed to another output or an input from being routed to another input. For example, referring again to FIG. 2, matrix 300 precludes an output from being routed to another output, and an input from being routed to another input. The arrangement of inputs 205a-e being provided on one side of matrix 300 (i.e., the column of C-switches 100 in matrix 300 with the most number of C-switches 100) and outputs 210a-e being provided on another side of matrix 300 (i.e., the row of C-switches 100 in matrix 300 with the most number of C-switches 100) prevents an output routing to another output, or an input routing to another input in any configuration of matrix 300. That is, in any combination of up and down positions of C-switches in matrix 300, a coupling path may not couple an output to another output, nor an input to another input.

Figure 4:
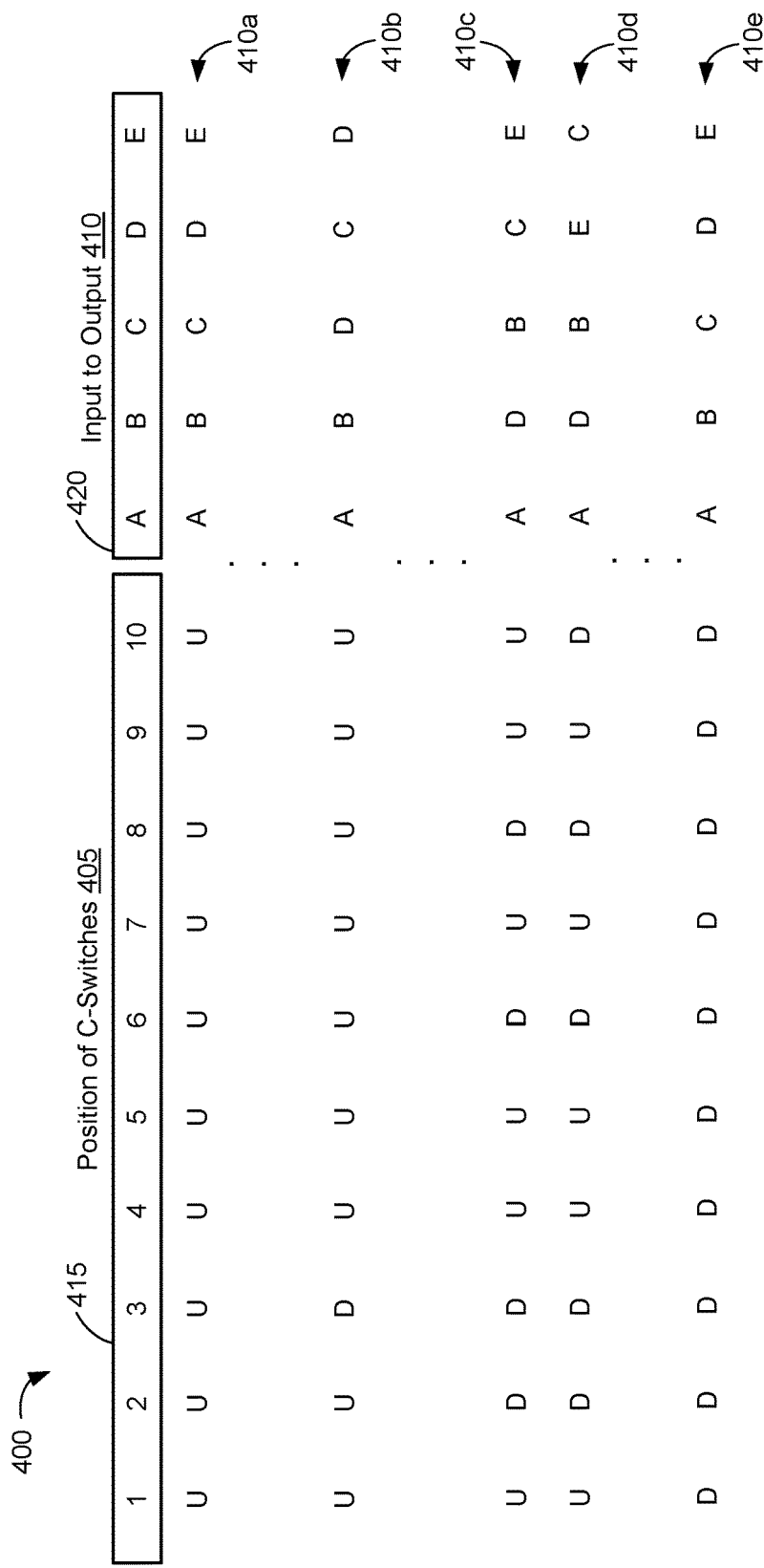
FIG. 4 shows a table illustrating examples of configurations of the arrangement of C-switches in FIG. 2.

FIG. 4 shows a table illustrating examples of configurations of the arrangement of C-switches in FIG. 2. FIG. 4 shows the angular positions (i.e., up or down) of the rotors of the C-switches in several configurations, as well as the corresponding input-to-output pairs provided by coupling paths established based on the up and down positions.

In table 400, Position of C-Switches 405 in the table indicates the position of C-switches. Input to Output 410 in the table indicates which input is routed to which output. Rows 410a-e each indicates different configurations of the arrangement of C-switches.

Header 415 includes numbers 1-10 for each C-switch 100(1)-(10). Each U in the column underneath the number in Header 415 indicates that the corresponding C-switch is in the up position, and each D in the column indicates that the corresponding C-switch is in the down position. For example, the position of C-switch 100(1) is indicated in the first column and is in the up position in rows 410a-d and in the down position in row 410e. The position of C-switch 100(7) is indicated in the seventh column and is in the up position in rows 410a-d and in the down position in row 410e.

In table 400, Header 420 indicates inputs 205a-e. Each A-E in the columns underneath header 420 indicate which of outputs 210a-e is the output that the input is routed towards based on the coupling paths established according to the positions of the C-switches for the row. For example, in row 410a, input 205a is routed to output 210a, input 205b is routed to output 210b, input 205c is routed to output 210c, input 205d is routed to output 210d, and input 205e is routed to output 210e. For row 410d, input 205a is routed to output 210a, input 205b is routed to output 210d, input 205c is routed to output 210b, input 205d is routed to output 210e, and input 205e is routed to output 210c.

Figure 5A:
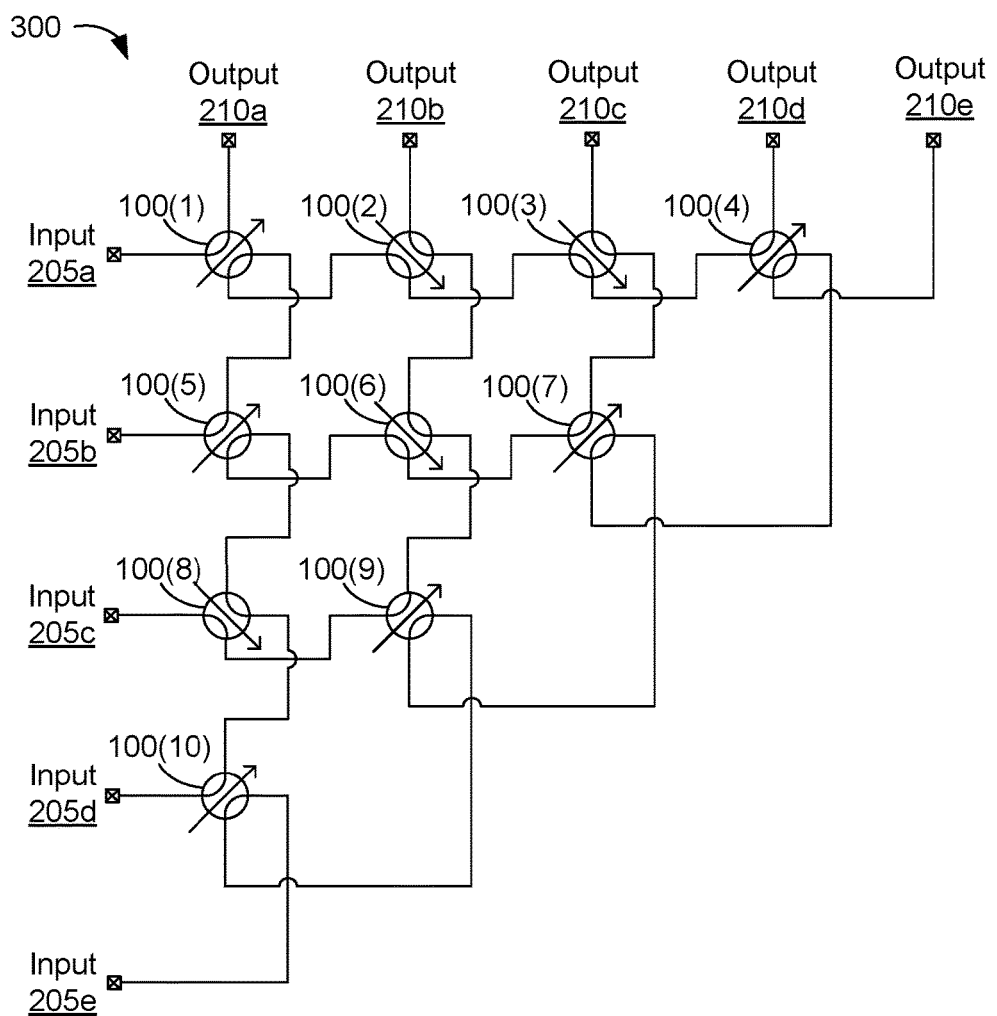
FIGS. 5A-C show examples of configurations of the arrangement of C-switches in FIG. 4.
Figure 5B:
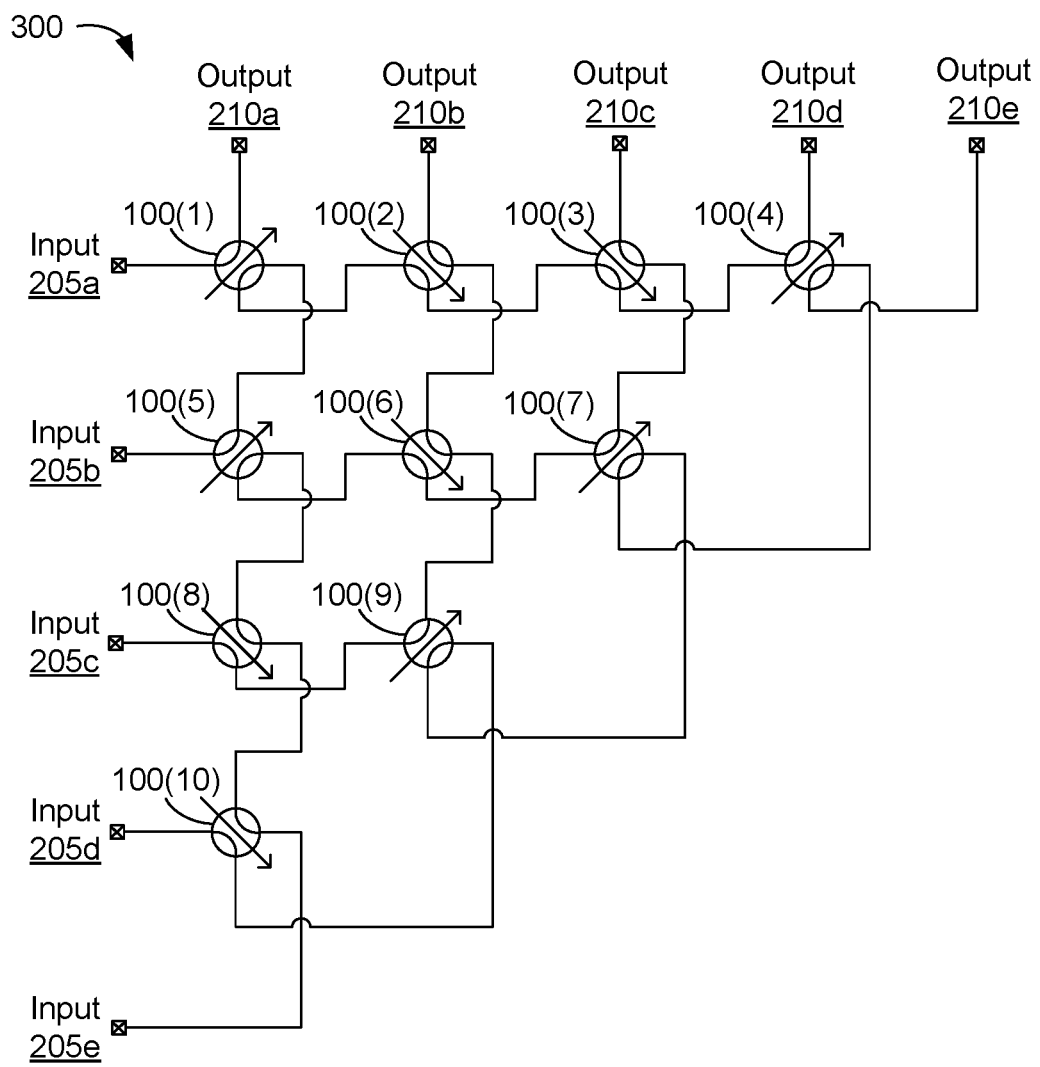
Figure 5C:
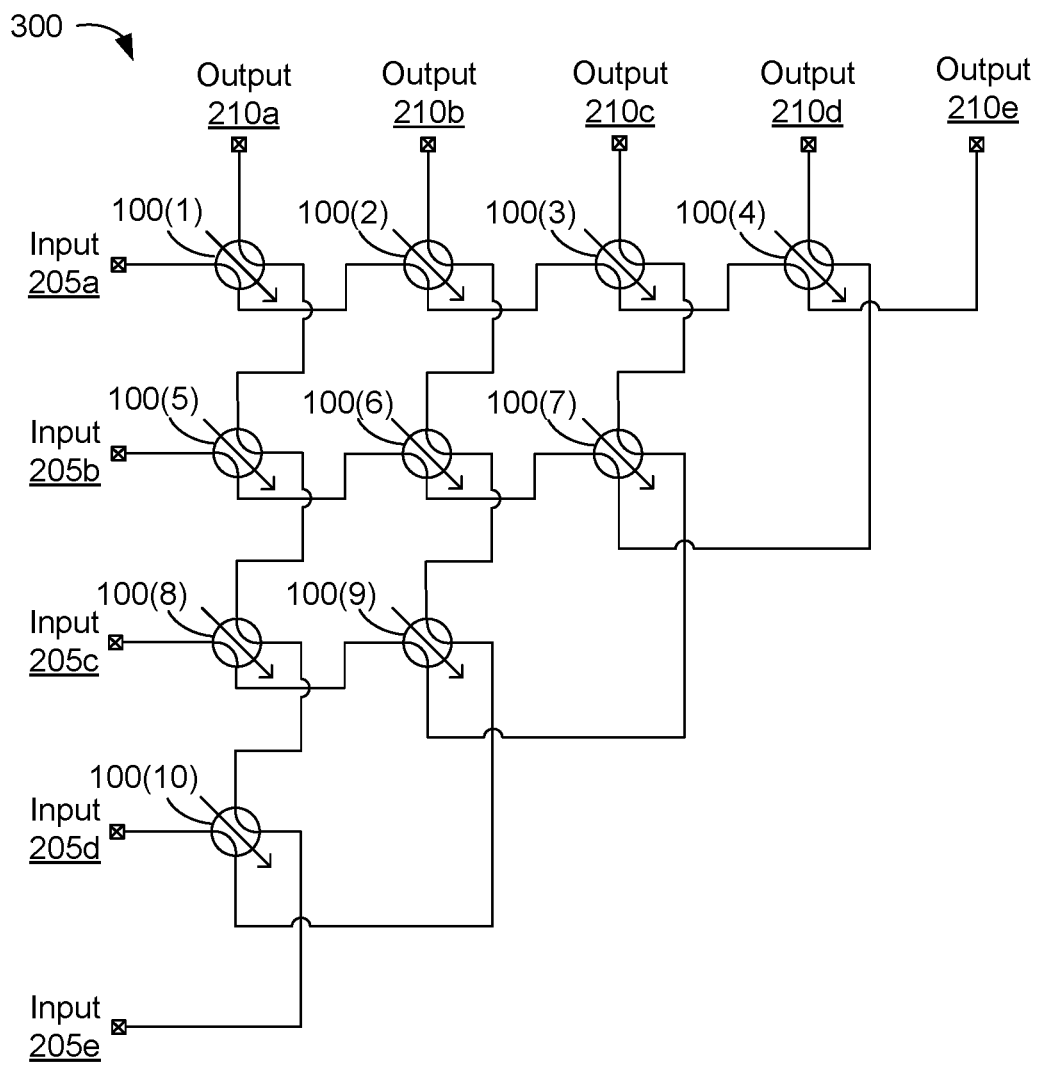

FIGS. 5A-C show examples of configurations of the arrangement of C-switches in FIG. 2 based on the configurations in the table of FIG. 4. FIG. 5A shows the configuration for row 410c. FIG. 5B shows the configuration for row 410d. FIG. 5C shows the configuration for row 410e.

Figure 6:
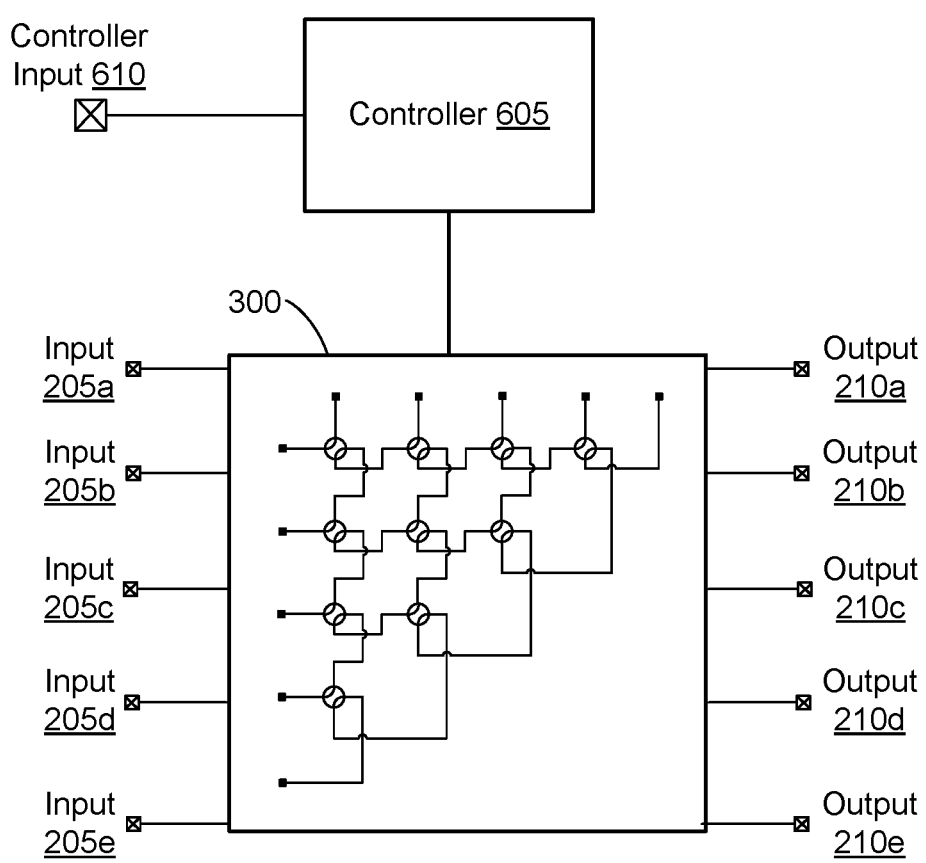
FIG. 6 shows an example of a system block diagram of a controller adjusting the configuration of the arrangement of C-switches.

FIG. 6 shows an example of a system block diagram of a controller adjusting the configurations of the arrangement of C-switches. In FIG. 6, controller 605 can change the angular positions of the C-switches of matrix 300 to change the routing of inputs to outputs.

As an example, controller 605 can receive data on Controller Input 610 indicating that a particular input should be routed to a particular output. Controller 605 can maintain a record of the current configuration of matrix 300 and determine which C-switches should be changed from the up position to the down position, and vice versa, such that the input can be routed to the output as indicated by the data, for example, by using similar information to that of table 400 in FIG. 4. In some implementations, Controller Input 610 can provide data indicating particular C-switches, the positions of those particular C-switches, or other types of data that can be used by controller 605 to adjust the configuration of matrix 300. For example, controller input 610 may provide data indicating the configurations of particular C-switches that should be adjusted (i.e., indicate whether the particular C-switches should be in the up or down positions). As a result, controller input 610 can provide indications on individual C-switches which when adjusted, the configuration of matrix 300 can be changed to provide the desired routing between inputs and outputs.

In some implementations, Controller 605 can sequentially adjust the angular positions of the C-switches one-at-a-time until the appropriate inputs are provided to the outputs. As a result, controller 605 can receive data corresponding to the configuration of matrix 300 or individual C-switches (e.g., the angular positions, such as up or down) and generate control signals to be provided to the respective C-switches to adjust the configuration of matrix 300.

For example, controller 605 may receive data and determine that input 205c should be routed to output 210d. Based on the configuration of matrix 300 in FIG. 3A, controller 605 can provide a signal to C-switch 100(3) to change the angular position of its rotor to the down position from the up position so that input 205c is routed to output 210d as in FIG. 3B.

Figure 7:
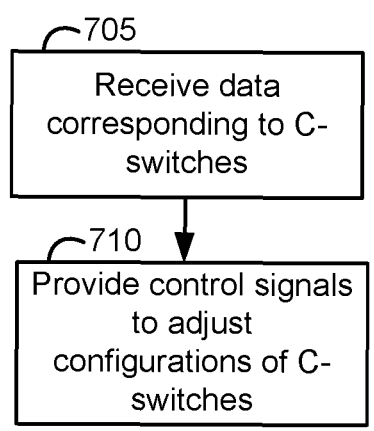
FIG. 7 is an example of a flowchart for adjusting a configuration of an arrangement of C-switches.

FIG. 7 is an example of a flowchart for adjusting a configuration of an arrangement of C-switches. In FIG. 7, at block 705, data corresponding to C-switches can be received. For example, controller 605 can receive controller input 610 indicating changes to be made to the configuration of matrix 300, for example, by adjusting the angular positions of one or more rotors of the C-switches. At block 710, control signals to adjust configurations of C-switches can be provided. For example, controller 605 can generate control signals to be provided to C-switches of matrix 300 in FIG. 6 so that the configuration of matrix 300 is changed to provide the proper routing between inputs 205a-e and outputs 210a-e.

As previously discussed, waveguides or coaxial cables can be used to provide interconnects between the C-switches 100 of matrix 300. Any combination of waveguides and coaxial cables may be used. For example, all of the interconnects can be coaxial cables, all of the interconnects may be waveguides, or the interconnects can be a mix of waveguides and coaxial cables.

The bandwidth of matrix 300, being implemented by electromechanical C-switches 100, may be larger than that of a solid-state switch matrix, such as one implemented by a channelizer. Additionally, the power consumption of matrix 300 may be lower than a switch matrix implemented by a solid-state channelizer. Moreover, the heat dissipation of the C-switches 100 of matrix 300 also may be lower than that of a solid-state channelizer.

Additionally, the configuration of matrix 300 can be changed to allow for redundant components to be switched in for components that have failed, for example, by changing the output that an input is coupled with, and therefore, direct the input to another component that may be coupled or configured to receive the output.

Implementations of the subject matter described in this specification may be implemented as one or more computer programs, i.e., one or more modules of computer program instructions, encoded on non-transitory computer readable medium for execution by, or to control the operation of, a data processing apparatus, such as, for example, controller 605.

Thus, improved switch matrix arrangements utilizing four port, two channel rotary switches have been disclosed. The foregoing merely illustrates principles of the invention. It will thus be appreciated that those skilled in the art will be able to devise numerous systems and methods which, although not explicitly shown or described herein, embody the principles of the invention and are thus within the spirit and scope of the invention as defined by the following claims.

What is claimed is:

1. An apparatus comprising:
a plurality of four port rotary C-switches arranged in a switch matrix, the switch matrix having N inputs and M outputs, wherein:
the plurality of C-switches are arranged in a plurality of columns and a plurality of rows, each column corresponding to a different number of C-switches in comparison with other columns, and each row corresponding to a different number of C-switches in comparison with other rows;
each of the plurality of C-switches is switchable from a first position to a second position, such that in the first position a first channel is coupled with a second channel and a third channel is coupled with a fourth channel, and, in the second position, the second channel is coupled with the fourth channel and the first channel is coupled with the third channel; and
the switch matrix is configured to provide a non-blocking switch-selectable routing between any of the N inputs and any of the M outputs, the switch selectable routing being determined by the respective positions of the plurality of C-switches.

2. The apparatus of claim 1, wherein N equals M.

3. The apparatus of claim 2, wherein the plurality of C-switches is a quantity of $(N(N-1))/2$ C-switches.

4. The apparatus of claim 1, wherein the plurality of C-switches include a first quantity of C-switches arranged in a first column of the plurality of columns, and a second quantity of C-switches arranged in a first row of the plurality of row.

5. The apparatus of claim 4, wherein:
the first quantity equals N−1;
one C-switch in the first column is coupled with two of the N inputs, each of a first remaining quantity of N−2 C-switches in the first column is coupled a respective one of the N inputs;
the second quantity equals M−1; and
one C-switch in the first row is coupled with two of the M outputs, each of a second remaining quantity of M−2 C-switches in the first row is coupled with one of the M outputs.

6. The apparatus of claim 4, wherein the plurality of rows include a second row, and each C-switch in the first row receives at least one input from C-switches in the second row.

7. The apparatus of claim 4, wherein the plurality of columns include a second column, and each C-switch in the first column provides an input to a C-switch in the second column.

8. The apparatus of claim 1, wherein the switch matrix comprises waveguides, coaxial cables, or a combination of both to communicatively couple the C-switches together.

9. The apparatus of claim 1, further comprising:
a controller configured to cause the switch matrix to switch between a plurality of switch-selectable routings by switching one or more of the C-switches in the switch matrix from the first position to the second position or the second position to the first position to route one of the N inputs to another output of the M outputs.

10. A system comprising:
a plurality of four port rotary C-switches arranged in a switch matrix, the switch matrix having N inputs and M outputs; and
a controller configured to provide control signals to the plurality of C-switches; wherein
each of the plurality of C-switches has a first input, a second input, a first output, and a second output, and each of the C-switches is configured to provide the first input to the first output and the second input to the second output in a first position and to provide the first input to the second output and the second input to the first output in a second position; and
the switch matrix is configured to provide a non-blocking switch-selectable routing between any of the N inputs and any of the M outputs, the switch selectable routing being determined by the control signals setting respective positions of the plurality of C-switches.

11. The system of claim 10, wherein the plurality of C-switches is a quantity of $(N(N-1))/2$ C-switches.

12. The system of claim 10, wherein N equals M.

13. The system of claim 10, wherein the C-switches in the switch matrix are arranged in columns and rows, each column corresponding to a different number of C-switches in comparison with other columns, and each row corresponding to a different number of C-switches in comparison with other rows.

14. The system of claim 13, wherein the columns includes a first column having N−1 C-switches and wherein the rows includes a first row having N−1 C-switches.

15. The system of claim 14, wherein:
one C-switch in the first column is coupled with two of the N inputs, each of a first remaining quantity of N−2 C-switches in the first column is coupled a respective one of the N inputs; and
one C-switch in the first row is coupled with two of the M outputs, each of a second remaining quantity of M−2 C-switches in the first row is coupled with one of the M outputs.

16. The system of claim 15, wherein:
the rows include a second row, and each C-switch in the first row receives at least one input from C-switches in the second row, and
the columns include a second column, and each C-switch in the first column provides an input to a C-switch in the second column.

17. The system of claim 10, wherein the switch matrix comprises waveguides, coaxial cables, or a combination of both to communicatively couple the C-switches together.

18. A method comprising:
receiving, by a controller, data corresponding to C-switches coupled together to provide a matrix having a set of inputs and a set of outputs, the matrix being a non-blocking switch matrix with $(N(N-1))/2$ number of C-switches; and
generating, by the controller, control signals to adjust configurations of the C-switches of the matrix to change the routing between the set of inputs and the set of outputs.

19. The method of claim 18, wherein the control signals are provided to sequentially adjust the C-switches.

\* \* \* \* \*

UNITED STATES PATENT AND TRADEMARK OFFICE
CERTIFICATE OF CORRECTION

PATENT NO. : 10,109,441 B1
APPLICATION NO. : 14/989612
DATED : October 23, 2018
INVENTOR(S) : Ali Shayegani It is certified that error appears in the above-identified patent and that said Letters Patent is hereby corrected as shown below:

On the Title Page

Item (54) and in the Specification, Column 1, Line 1, change "NON-BLOCKINGS SWITCH MATRIX" to --NON-BLOCKING SWITCH MATRIX--.

Signed and Sealed this
Twenty-third Day of June, 2020

Andrei Iancu
*Director of the United States Patent and Trademark Office*